(12) United States Patent
Nakahata et al.

(10) Patent No.: US 7,915,149 B2
(45) Date of Patent: Mar. 29, 2011

(54) GALLIUM NITRIDE SUBSTRATE AND GALLIUM NITRIDE LAYER FORMATION METHOD

(75) Inventors: Seiji Nakahata, Itami (JP); Fumitaka Sato, Itami (JP); Yoshiki Miura, Itami (JP); Akinori Koukitu, Koganei (JP); Yoshinao Kumagai, Koganei (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 307 days.

(21) Appl. No.: 12/136,275

(22) Filed: Jun. 10, 2008

(65) Prior Publication Data
US 2008/0308814 A1    Dec. 18, 2008

(30) Foreign Application Priority Data
Jun. 15, 2007    (JP) ................. P2007-159436

(51) Int. Cl.
*H01L 21/00*    (2006.01)
(52) U.S. Cl. ........................ 438/480; 257/78
(58) Field of Classification Search .............. 257/78; 438/480
See application file for complete search history.

(56) References Cited

U.S. PATENT DOCUMENTS

| | | | |
|---|---|---|---|
| 6,440,823 B1 * | 8/2002 | Vaudo et al. | 438/478 |
| 7,170,095 B2 | 1/2007 | Vaudo et al. | |
| 7,518,216 B2 * | 4/2009 | Koukitu et al. | 257/615 |
| 2005/0009310 A1 * | 1/2005 | Vaudo et al. | 438/543 |
| 2007/0215982 A1 * | 9/2007 | Koukitu et al. | 257/607 |

FOREIGN PATENT DOCUMENTS

JP    2005-306723    11/2005

OTHER PUBLICATIONS

Hubbard, S.M. "High-resistivity GaN buffer templates and their optimization for GaN-based HFETs" Jour. of Crys. Grow. 284 pp. 297-305 published Sep. 8, 2005.*

* cited by examiner

*Primary Examiner* — N Drew Richards
*Assistant Examiner* — Grant S Withers
(74) *Attorney, Agent, or Firm* — Drinker Biddle & Reath LLP

(57) ABSTRACT

There is disclosed a method for forming a gallium nitride layer of which resistivity is $1 \times 10^6$ Ω·cm or more, including steps of: forming a gallium nitride layer containing iron on a substrate; and heating said gallium nitride layer formed on said substrate.

4 Claims, 12 Drawing Sheets

Fig.2
(A)
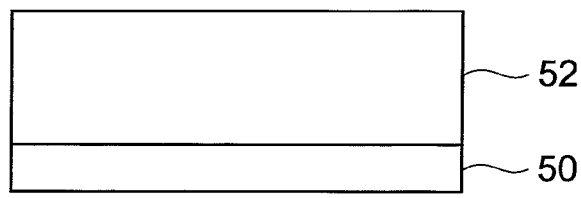
(B)
(C)
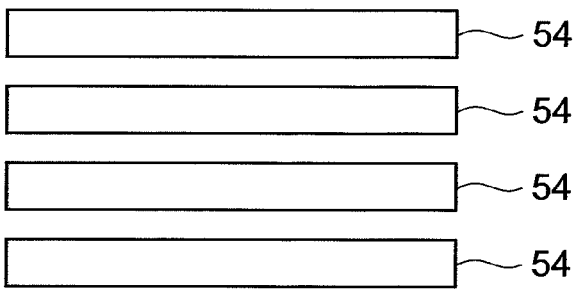
(D)
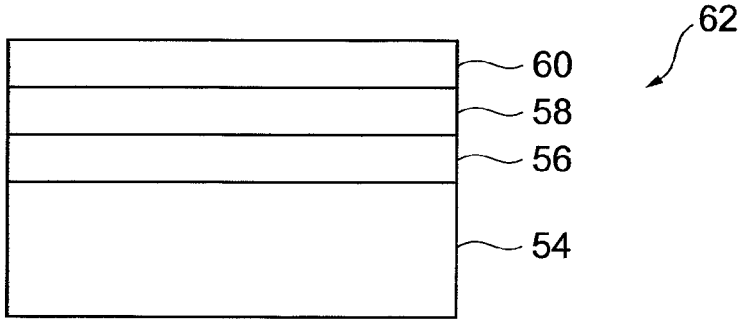

*Fig.3*
(A)
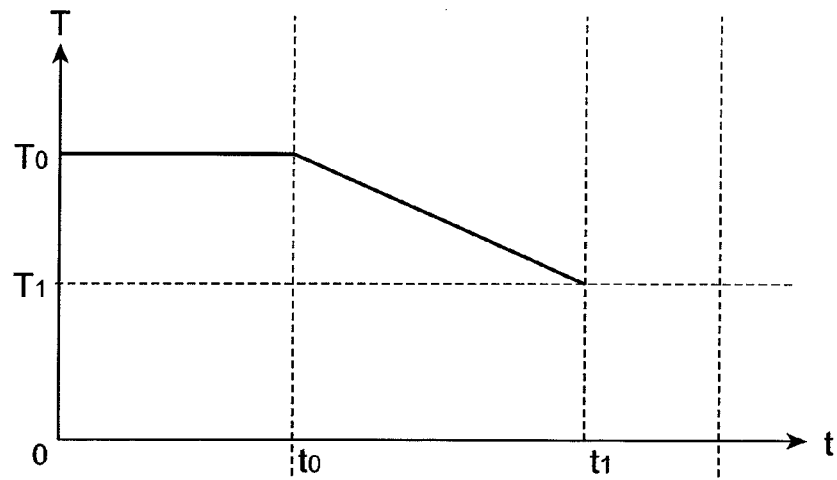
(B)
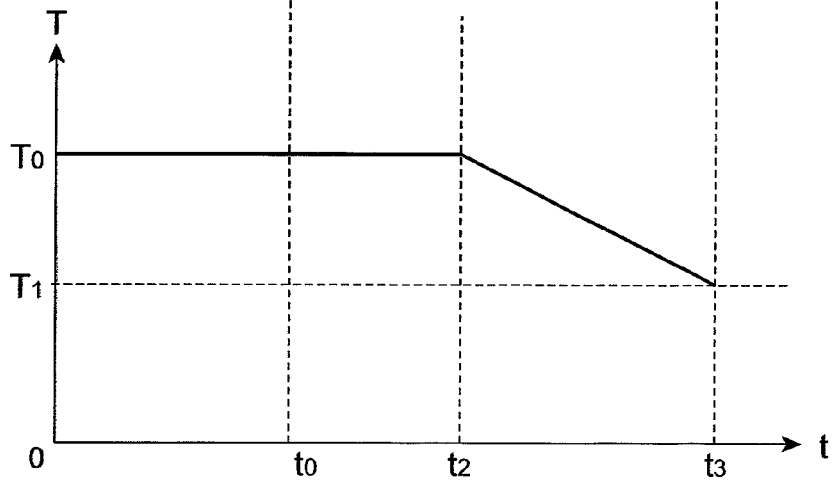

Fig.6

| | IRON CONCENTRATION cm$^{-3}$ | TEMPERATURE DROPPING SPEED °C/MINUTE | GROWTH TEMPERATURE (T$_0$) °C | ANNEALING TERMINATION TEMPERATURE (T$_1$) °C | ANNEALING TIME MINUTE | CARBON CONCENTRATION cm$^{-3}$ | OFF ANGLE deg <11-20> | OFF ANGLE deg <1-100> | DISLOCATION DENSITY cm$^{-2}$ | RESISTIVITY Ω·cm | YIELD % |
|---|---|---|---|---|---|---|---|---|---|---|---|
| REFERENCE EXAMPLE 1-1 | 5.0E+16 | 100 | 1100 | 500 | 6 | DETECTION LIMIT OR LESS | 0.01 | 0.01 | 5.0E+07 | 5.0E+05 | 68 |
| REFERENCE EXAMPLE 1-2 | 5.0E+19 | 100 | 1100 | 500 | 6 | DETECTION LIMIT OR LESS | 0.01 | 0.01 | 5.0E+07 | 9.0E+18 | 65 |
| EXAMPLE 1-1 | 5.0E+16 | 50 | 1100 | 500 | 12 | DETECTION LIMIT OR LESS | 0.01 | 0.01 | 5.0E+07 | 1.0E+06 | 86 |
| EXAMPLE 1-2 | 5.0E+16 | 30 | 1100 | 500 | 20 | DETECTION LIMIT OR LESS | 0.01 | 0.01 | 5.0E+07 | 1.5E+06 | 90 |
| EXAMPLE 1-3 | 5.0E+16 | 15 | 1100 | 500 | 40 | DETECTION LIMIT OR LESS | 0.01 | 0.01 | 5.0E+07 | 2.0E+06 | 92 |
| EXAMPLE 1-4 | 5.0E+16 | 10 | 1100 | 500 | 60 | DETECTION LIMIT OR LESS | 0.01 | 0.01 | 5.0E+07 | 2.2E+06 | 92 |
| EXAMPLE 1-5 | 5.0E+16 | 2 | 1100 | 500 | 300 | DETECTION LIMIT OR LESS | 0.01 | 0.01 | 5.0E+07 | 2.2E+06 | 95 |
| EXAMPLE 1-6 | 5.0E+19 | 50 | 1100 | 500 | 12 | 1.7E+15 | 0.01 | 0.01 | 5.0E+07 | 3.0E+11 | 80 |
| EXAMPLE 1-7 | 5.0E+19 | 30 | 1100 | 500 | 20 | 1.7E+15 | 0.01 | 0.01 | 5.0E+07 | 4.0E+11 | 85 |
| EXAMPLE 1-8 | 5.0E+19 | 15 | 1100 | 500 | 40 | 1.7E+15 | 0.01 | 0.01 | 5.0E+07 | 5.0E+11 | 88 |
| EXAMPLE 1-9 | 5.0E+19 | 10 | 1100 | 500 | 60 | 1.7E+18 | 0.01 | 0.01 | 5.0E+07 | 5.5E+11 | 88 |
| EXAMPLE 1-10 | 5.0E+19 | 2 | 1100 | 500 | 300 | 1.7E+18 | 0.01 | 0.01 | 5.0E+07 | 5.5E+11 | 89 |
| EXAMPLE 2-1 | 5.0E+16 | 50 | 1050 | 500 | 11 | 1.7E+15 | 0.01 | 0.01 | 5.0E+07 | 1.0E+06 | 86 |
| EXAMPLE 2-2 | 5.0E+19 | 50 | 1050 | 500 | 11 | 1.7E+18 | 0.01 | 0.01 | 5.0E+07 | 2.9E+11 | 88 |
| EXAMPLE 2-3 | 5.0E+16 | 50 | 1200 | 500 | 14 | 1.7E+15 | 0.01 | 0.01 | 5.0E+07 | 1.5E+06 | 92 |
| EXAMPLE 2-4 | 5.0E+19 | 50 | 1200 | 500 | 14 | 1.7E+18 | 0.01 | 0.01 | 5.0E+07 | 4.2E+11 | 87 |

Fig.7

| | IRON CONCENTRATION cm$^{-3}$ | GROWTH TEMPERATURE (T₀) °C | HOLDING TIME MINUTE | TEMPERATURE DROPPING SPEED °C/MINUTE | TEMPERATURE DROPPING TIME MINUTE | ANNEALING TIME MINUTE | CARBON CONCENTRATION cm$^{-3}$ | OFF ANGLE deg <11-20> | OFF ANGLE deg <1-100> | DISLOCATION DENSITY cm$^{-2}$ | RESISTIVITY Ω·cm | YIELD % |
|---|---|---|---|---|---|---|---|---|---|---|---|---|
| EXAMPLE 3-1 | 5.0E+16 | 1100 | 5 | 100 | 6 | 11 | 1.7E+15 | 0.01 | 0.01 | 5.0E+07 | 1.8E+06 | 92 |
| EXAMPLE 3-2 | 5.0E+19 | | | | | | 1.7E+18 | | | | 4.5E+11 | 88 |

Fig.8

| | IRON CONCENTRATION cm$^{-3}$ | TEMPERATURE DROPPING SPEED °C/MINUTE | GROWTH TEMPERATURE (T$_0$) °C | ANNEALING TERMINATION TEMPERATURE (T$_1$) °C | ANNEALING TIME MINUTE | CARBON CONCENTRATION cm$^{-3}$ | OFF ANGLE deg <11-20> | OFF ANGLE deg <1-100> | DISLOCATION DENSITY cm$^{-2}$ | RESISTIVITY Ω·cm | YIELD % |
|---|---|---|---|---|---|---|---|---|---|---|---|
| EXAMPLE 4-1 | | | | | | | 0.03 | | | 1.2E+06 | 84 |
| EXAMPLE 4-2 | | | | | | | 0.2 | | | 2.0E+06 | 88 |
| EXAMPLE 4-3 | | | | | | | 0.5 | | | 2.5E+06 | 90 |
| EXAMPLE 4-4 | | | | | | | 1 | | | 2.8E+06 | 90 |
| EXAMPLE 4-5 | | | | | | | 5 | 0.01 | | 3.1E+06 | 90 |
| EXAMPLE 4-6 | | | | | | | 10 | | | 3.2E+06 | 90 |
| EXAMPLE 4-7 | | | | | | | 20 | | | 3.2E+06 | 90 |
| EXAMPLE 4-8 | | | | | | | 30 | | | 3.3E+06 | 90 |
| EXAMPLE 4-9 | | | | | | | 60 | | | 3.3E+06 | 90 |
| EXAMPLE 4-10 | | | | | | | | 0.03 | | 1.4E+06 | 84 |
| EXAMPLE 4-11 | | | | | | | | 0.2 | | 2.4E+06 | 86 |
| EXAMPLE 4-12 | | | | | | | | 0.5 | | 3.0E+06 | 90 |
| EXAMPLE 4-13 | | | | | | | | 1 | | 3.4E+06 | 90 |
| EXAMPLE 4-14 | 5.0E+16 | | | | | 1.7E+15 | 0.01 | 5 | | 3.7E+06 | 90 |
| EXAMPLE 4-15 | | | | | | | | 10 | | 3.8E+06 | 90 |
| EXAMPLE 4-16 | | | | | | | | 20 | | 3.8E+06 | 90 |
| EXAMPLE 4-17 | | | | | | | | 30 | | 4.0E+06 | 90 |
| EXAMPLE 4-18 | | | | | | | | 60 | | 4.0E+06 | 90 |
| EXAMPLE 4-19 | | | | | | | 0.03 | 0.03 | | 1.6E+06 | 88 |
| EXAMPLE 4-20 | | | | | | | 0.2 | 0.2 | | 2.6E+06 | 89 |
| EXAMPLE 4-21 | | | | | | | 0.5 | 0.5 | | 3.3E+06 | 91 |
| EXAMPLE 4-22 | | | | | | | 1 | 1 | | 3.7E+06 | 92 |
| EXAMPLE 4-23 | | | | | | | 5 | 5 | | 4.1E+06 | 92 |
| EXAMPLE 4-24 | | | | | | | 10 | 10 | | 4.2E+06 | 94 |
| EXAMPLE 4-25 | | | | | | | 20 | 20 | | 4.2E+06 | 94 |
| EXAMPLE 4-26 | | | | | | | 30 | 30 | | 4.4E+06 | 94 |
| EXAMPLE 4-27 | | 60 | 1100 | 500 | 10 | | 60 | 60 | 5.0E+07 | 4.4E+06 | 94 |
| EXAMPLE 4-28 | | | | | | | 0.03 | | | 3.5E+11 | 81 |
| EXAMPLE 4-29 | | | | | | | 0.2 | | | 5.0E+11 | 84 |
| EXAMPLE 4-30 | | | | | | | 0.5 | | | 5.5E+11 | 86 |
| EXAMPLE 4-31 | | | | | | | 1 | | | 5.8E+11 | 86 |
| EXAMPLE 4-32 | | | | | | | 5 | 0.01 | | 6.0E+11 | 86 |
| EXAMPLE 4-33 | | | | | | | 10 | | | 6.1E+11 | 86 |
| EXAMPLE 4-34 | | | | | | | 20 | | | 6.1E+11 | 86 |
| EXAMPLE 4-35 | | | | | | | 30 | | | 6.2E+11 | 86 |
| EXAMPLE 4-36 | | | | | | | 60 | | | 6.2E+11 | 86 |
| EXAMPLE 4-37 | | | | | | | | 0.03 | | 4.2E+11 | 81 |
| EXAMPLE 4-38 | | | | | | | | 0.2 | | 6.0E+11 | 83 |
| EXAMPLE 4-39 | | | | | | | | 0.5 | | 6.6E+11 | 86 |
| EXAMPLE 4-40 | | | | | | | | 1 | | 7.0E+11 | 86 |
| EXAMPLE 4-41 | 5.0E+19 | | | | | 1.7E+18 | 0.01 | 5 | | 7.2E+11 | 86 |
| EXAMPLE 4-42 | | | | | | | | 10 | | 7.3E+11 | 86 |
| EXAMPLE 4-43 | | | | | | | | 20 | | 7.3E+11 | 86 |
| EXAMPLE 4-44 | | | | | | | | 30 | | 7.4E+11 | 86 |
| EXAMPLE 4-45 | | | | | | | | 60 | | 7.4E+11 | 86 |
| EXAMPLE 4-46 | | | | | | | 0.03 | 0.03 | | 4.6E+11 | 84 |
| EXAMPLE 4-47 | | | | | | | 0.2 | 0.2 | | 6.6E+11 | 85 |
| EXAMPLE 4-48 | | | | | | | 0.5 | 0.5 | | 7.3E+11 | 88 |
| EXAMPLE 4-49 | | | | | | | 1 | 1 | | 7.7E+11 | 89 |
| EXAMPLE 4-50 | | | | | | | 5 | 5 | | 7.9E+11 | 89 |
| EXAMPLE 4-51 | | | | | | | 10 | 10 | | 8.1E+11 | 90 |
| EXAMPLE 4-52 | | | | | | | 20 | 20 | | 8.1E+11 | 90 |
| EXAMPLE 4-53 | | | | | | | 30 | 30 | | 8.2E+11 | 90 |
| EXAMPLE 4-54 | | | | | | | 60 | 60 | | 8.2E+11 | 90 |

Fig.9

| | IRON CONCENTRATION cm$^{-3}$ | TEMPERATURE DROPPING SPEED °C/MINUTE | GROWTH TEMPERATURE (T0) °C | ANNEALING TERMINATION TEMPERATURE (T1) °C | ANNEALING TIME MINUTE | CARBON CONCENTRATION cm$^{-3}$ | OFF ANGLE deg <11-20> | OFF ANGLE deg <1-100> | DISLOCATION DENSITY cm$^{-2}$ | RESISTIVITY Ω·cm | YIELD % |
|---|---|---|---|---|---|---|---|---|---|---|---|
| EXAMPLE 5-1 | 5.0E+16 | 60 | 1100 | 500 | 10 | 4.0E+15 | 0.01 | 0.01 | 5.0E+07 | 2.0E+06 | 89 |
| EXAMPLE 5-2 | | | | | | 1.6E+16 | | | | 2.0E+06 | 85 |
| EXAMPLE 5-3 | 5.0E+19 | | | | | 2.5E+18 | | | | 2.0E+06 | 86 |
| EXAMPLE 5-4 | | | | | | 1.0E+19 | | | | 2.0E+06 | 84 |

Fig.10

| | IRON CONCENTRATION cm$^{-3}$ | TEMPERATURE DROPPING SPEED °C/MINUTE | GROWTH TEMPERATURE (T$_0$) °C | ANNEALING TERMINATION TEMPERATURE (T$_1$) °C | ANNEALING TIME MINUTE | CARBON CONCENTRATION cm$^{-3}$ | OFF ANGLE deg $\langle 11-20 \rangle$ | OFF ANGLE deg $\langle 1-100 \rangle$ | DISLOCATION DENSITY cm$^{-2}$ | RESISTIVITY Ω·cm | YIELD % |
|---|---|---|---|---|---|---|---|---|---|---|---|
| EXAMPLE 6-1 | 5.0E+16 | 60 | 1100 | 500 | 10 | 1.7E+15 | 0.01 | | 1.0E+07 | 1.1E+06 | 86 |
| EXAMPLE 6-2 | | | | | | | | | 4.0E+06 | 1.3E+06 | 86 |
| EXAMPLE 6-3 | | | | | | | | | 1.0E+06 | 2.0E+06 | 86 |
| EXAMPLE 6-4 | | | | | | | | | 3.0E+05 | 2.5E+06 | 86 |
| EXAMPLE 6-5 | 5.0E+19 | | | | | 1.7E+18 | | 0.01 | 1.0E+07 | 2.0E+11 | 84 |
| EXAMPLE 6-6 | | | | | | | | | 4.0E+06 | 2.3E+11 | 84 |
| EXAMPLE 6-7 | | | | | | | | | 1.0E+06 | 2.5E+11 | 84 |
| EXAMPLE 6-8 | | | | | | | | | 3.0E+05 | 3.0E+11 | 84 |

Fig.11

| | SUBSTRATE MATERIAL | IRON CONCENTRATION cm$^{-3}$ | TEMPERATURE DROPPING SPEED °C/MINUTE | GROWTH TEMPERATURE (T$_0$) °C | ANNEALING TERMINATION TEMPERATURE (T$_1$) °C | ANNEALING TIME MINUTE | CARBON CONCENTRATION cm$^{-3}$ | OFF ANGLE deg ⟨11-20⟩ | OFF ANGLE deg ⟨1-100⟩ | DISLOCATION DENSITY cm$^{-2}$ | RESISTIVITY Ω·cm | YIELD % |
|---|---|---|---|---|---|---|---|---|---|---|---|---|
| EXAMPLE 7-1 | SAPPHIRE | 5.0E+19 | 60 | 1100 | 500 | 10 | 1.7E+18 | | | 5.0E+07 | 5.1E+11 | 83 |
| EXAMPLE 7-2 | | | | | | | | 0.2 | 0.2 | | 7.3E+11 | 90 |
| EXAMPLE 7-3 | | | | | | | | 1 | 1 | | 8.0E+11 | 89 |
| EXAMPLE 7-4 | GaAs | | | | | | | 0.2 | 0.2 | | 8.4E+11 | 90 |
| EXAMPLE 7-5 | | | | | | | | 5 | 5 | | 8.7E+11 | 90 |
| EXAMPLE 7-6 | | | | | | | | 10 | 10 | | 8.9E+11 | 90 |
| EXAMPLE 7-7 | | | | | | | | 30 | 30 | | 8.9E+11 | 88 |
| EXAMPLE 7-8 | SiC | | | | | | | 0.2 | 0.2 | | 9.0E+11 | 92 |
| EXAMPLE 7-9 | | | | | | | | 1 | 1 | | 9.0E+11 | 90 |
| EXAMPLE 7-10 | | | | | | | | 10 | 10 | | 5.6E+11 | 90 |
| | | | | | | | | 60 | 60 | | | |

Fig. 12

| | IRON CONCENTRATION cm⁻³ | TEMPERATURE DROPPING SPEED °C/MINUTE | GROWTH TEMPERATURE (T₀) °C | ANNEALING TERMINATION TEMPERATURE (T₁) °C | ANNEALING TIME MINUTE | CARBON CONCENTRATION cm⁻³ | OFF ANGLE deg ⟨11-20⟩ | OFF ANGLE deg ⟨1-100⟩ | DISLOCATION DENSITY cm⁻² | RESISTIVITY Ω·cm | YIELD % |
|---|---|---|---|---|---|---|---|---|---|---|---|
| EXAMPLE 8-1 | 5.0E+16 | 30 | 1100 | 500 | 20 | 5.0E+15 | 0.01 | 0.01 | 5.0E+07 | 2.5E+06 | 92 |
| EXAMPLE 8-2 | 5.0E+19 | 30 | 1100 | 500 | 20 | 5.0E+18 | 0.01 | 0.01 | 5.0E+07 | 4.5E+11 | 88 |
| EXAMPLE 9-1 | 5.0E+16 | 30 | 1100 | 500 | 20 | 1.7E+15 | 0.2 | 0.2 | 5.0E+07 | 2.2E+06 | 92 |
| EXAMPLE 9-2 | 5.0E+19 | 30 | 1100 | 500 | 20 | 1.7E+18 | 0.2 | 0.2 | 5.0E+07 | 5.0E+11 | 88 |
| EXAMPLE 10-1 | 5.0E+16 | 30 | 1100 | 500 | 20 | 1.7E+15 | 0.01 | 0.01 | 2.0E+06 | 1.8E+06 | 91 |
| EXAMPLE 10-2 | 5.0E+19 | 30 | 1100 | 500 | 20 | 1.7E+18 | 0.01 | 0.01 | 2.0E+06 | 4.5E+06 | 85 |
| EXAMPLE 11-1 | 5.0E+16 | 30 | 1100 | 500 | 20 | 5.0E+15 | 0.01 | 0.01 | 2.0E+06 | 2.0E+06 | 89 |
| EXAMPLE 11-2 | 5.0E+19 | 30 | 1100 | 500 | 20 | 5.0E+18 | 0.01 | 0.01 | 2.0E+06 | 2.5E+11 | 88 |
| EXAMPLE 12-1 | 5.0E+16 | 60 | 1100 | 800 | 5 | 1.7E+15 | 0.2 | 0.2 | 5.0E+07 | 3.0E+06 | 91 |
| EXAMPLE 12-2 | 5.0E+19 | 60 | 1100 | 800 | 5 | 1.7E+18 | 0.2 | 0.2 | 5.0E+07 | 7.0E+11 | 89 |
| EXAMPLE 13-1 | 5.0E+16 | 60 | 1100 | 800 | 5 | 5.0E+15 | 0.2 | 0.2 | 5.0E+07 | 3.0E+06 | 89 |
| EXAMPLE 13-2 | 5.0E+19 | 60 | 1100 | 800 | 5 | 5.0E+18 | 0.2 | 0.2 | 5.0E+07 | 7.0E+11 | 86 |
| EXAMPLE 14-1 | 5.0E+16 | 30 | 1100 | 500 | 20 | 5.0E+15 | 0.01 | 0.01 | 2.0E+06 | 3.5E+06 | 94 |
| EXAMPLE 14-2 | 5.0E+19 | 30 | 1100 | 500 | 20 | 5.0E+18 | 0.01 | 0.01 | 2.0E+06 | 7.8E+11 | 90 |
| EXAMPLE 15-1 | 5.0E+16 | 30 | 1100 | 500 | 20 | 5.0E+15 | 0.01 | 0.01 | 2.0E+06 | 2.0E+06 | 94 |
| EXAMPLE 15-2 | 5.0E+19 | 30 | 1100 | 500 | 20 | 5.0E+18 | 0.01 | 0.01 | 2.0E+06 | 4.5E+11 | 90 |
| EXAMPLE 16-1 | 5.0E+16 | 60 | 1100 | 800 | 5 | 5.0E+15 | 0.2 | 0.2 | 2.0E+06 | 3.5E+06 | 94 |
| EXAMPLE 16-2 | 5.0E+19 | 60 | 1100 | 800 | 5 | 5.0E+18 | 0.2 | 0.2 | 2.0E+06 | 7.8E+11 | 91 |
| EXAMPLE 17-1 | 5.0E+16 | 30 | 1100 | 500 | 20 | 5.0E+15 | 0.2 | 0.2 | 2.0E+06 | 4.2E+06 | 97 |
| EXAMPLE 17-2 | 5.0E+19 | 30 | 1100 | 500 | 20 | 5.0E+18 | 0.2 | 0.2 | 2.0E+06 | 8.3E+11 | 95 |

GALLIUM NITRIDE SUBSTRATE AND GALLIUM NITRIDE LAYER FORMATION METHOD

BACKGROUND OF THE INVENTION

1. Field of the Invention

The present invention relates to a gallium nitride substrate and a gallium nitride layer formation method.

2. Related Background Art

A gallium nitride substrate which has a $5\times10^{16}$ cm$^{-3}$ or higher iron concentration and a 100 μm or more thickness (see Japanese Patent Application Laid-Open No. 2005-306723) is known. The resistivity of this gallium nitride substrate is $1\times10^7$ Ω·cm or more.

SUMMARY OF THE INVENTION

However if the iron concentration is increased to increase the resistivity, as in the case of the above mentioned gallium nitride substrate, the gallium nitride crystals tend to be brittle. Therefore the crack generation rate of the gallium nitride substrate increases. A gallium nitride substrate, in which a crack is generated, becomes a defective product. Hence the fabrication yield of gallium nitride substrate still has room for improvement.

With the foregoing in view, it is an object of the present invention to provide a gallium nitride substrate of which resistivity is high and crack generation rate is low, and a method for forming such a gallium nitride layer.

To solve the above problem, a method for forming a gallium nitride layer of the present invention is a method for forming a gallium nitride layer of which resistivity is $1\times10^6$ Ω·cm or more, comprising: a step of forming a gallium nitride layer containing iron on a substrate; and a step of heating the gallium nitride layer formed on the substrate.

In the method for forming a gallium nitride layer of the present invention, a gallium nitride layer of which crack generation rate is low can be formed by heating a gallium nitride layer containing iron. The reason for this is not perfectly clear, but may be explained as follows. Iron (Fe) frequently exists in a crystal lattice formed of gallium (Ga) and nitrogen (N), and generates a distortion of crystals. If the gallium nitride layer is heated, Fe existing in the crystal lattice moves to the Ga site. As a result, the distortion of crystals is improved, and the crack generation rate of the gallium nitride layer decreases. The resistivity of the gallium nitride layer becomes high, which is $1\times10^6$ Ω·cm or more.

It is preferable that the gallium nitride layer is heated at 800° C. or higher for five minutes or more. In this case, the crack generation rate can be further decreased.

It is also preferable that the gallium nitride layer is heated at 50° C./minute or less of the temperature falling rate. In this case, the crack generation rate can be further decreased.

It is also preferable that the surface of the gallium nitride layer is inclined 0.03° or more from the (0001) plane of the gallium nitride layer. In this case, the crack generation rate can be further decreased. The reason is not perfectly clear, but may be explained as follows. Micro-step differences are formed on the surface of the gallium nitride layer. Since Fe is filled from the corners of the step differences, Fe easily enters the Ga site. As a result, the crack generation rate of the gallium nitride layer decreases.

It is also preferable that the gallium nitride layer contains carbon. In this case, the crack generation rate can be further decreased. The reason is not perfectly clear, but may be explained as follows. Fe enters the Ga side and C enters the N site, and an Fe—C bond is formed. Since the distortion of the Fe—C bond is smaller than the Fe—N bond, the crack generation rate of the gallium nitride layer decreases.

It is also preferable that the concentration of carbon in the gallium nitride layer is ½₀ to ⅕ of the concentration of iron in the gallium nitride layer. In this case, the crack generation rate can be further decreased.

It is also preferable that the dislocation density of the gallium nitride layer is $1\times10^7$ cm$^{-2}$ or less. In this case, the crack generation rate can be further decreased. The reason is not perfectly clear, but may be explained as follows. Fe normally tends to concentrate in spaces near a dislocation, and if Fe concentrates in a specific area, the crack generation rate increases. If the dislocation density of the gallium nitride layer is $1\times10^7$ cm$^{-2}$ or less, Fe disperses throughout the entire gallium nitride layer. Therefore the crack generation rate decreases.

A method for forming a gallium nitride layer of the present invention comprises a step of forming a gallium nitride layer, of which resistivity is $1\times10^6$ Ω·cm or more, and which contains iron, on a substrate, wherein the surface of the gallium nitride layer is inclined 0.03° or more from the (0001) plane of the gallium nitride layer.

In the method for forming a gallium nitride layer of the present invention, a gallium nitride layer, of which crack generation rate is low, can be generated. The reason is not perfectly clear, but may be explained as follows. Micro-step differences are formed on the surface of the gallium nitride layer. Since Fe is filled from the corners of the step differences, Fe easily enters the Ga site. As result, the crack generation rate of the gallium nitride layer decreases. The resistivity of the gallium nitride layer becomes high, which is $1\times10^6$ Ω·cm or more.

It is also preferable that the gallium nitride layer contains carbon. In this case, the crack generation rate can be further decreased. The reason is not perfectly clear, but may be explained as follows. Fe enters the Ga site, and C enters the N site, and an Fe—C bond is formed. Since distortion of the Fe—C bond is smaller than the Fe—N bond, the crack generation rate of the gallium nitride layer decreases.

It is also preferable that the concentration of carbon in the gallium nitride layer is ½₀ to ⅕ of the concentration of iron in the gallium nitride layer. In this case, the crack generation rate can be further decreased.

It is also preferable that the dislocation density of the gallium nitride layer is $1\times10^7$ cm$^{-2}$ or less. In this case, the crack generation rate can be further decreased. The reason is not perfectly clear, but may be explained as follows. Fe normally tends to concentrate in spaces near a dislocation, and if Fe concentrates in a specific area, the crack generation rate increases. If the dislocation density of the gallium nitride layer is $1\times10^7$ cm$^{-2}$ or less, Fe disperses throughout the entire gallium nitride layer. Therefore the crack generation rate decreases.

A method for forming a gallium nitride layer of the present invention comprises a step of forming a gallium nitride layer, of which resistivity is $1\times10^6$ Ω·cm or more and which contains iron and carbon, on a substrate.

In the method for forming a gallium nitride layer of the present invention, a gallium nitride layer, of which crack generation rate is low, can be formed. The reason is not perfectly clear, but may be explained as follows. Fe enters the Ga site and C enters the N site, and an Fe—C bond is formed. Since distortion of the Fe—C bond is smaller than the Fe—N bond, the crack generation rate of the gallium nitride layer decreases. The resistivity of the gallium nitride layer becomes high, which is $1\times10^6$ Ω·cm or more.

It is preferable that the concentration of carbon in the gallium nitride layer is $\frac{1}{20}$ to $\frac{1}{5}$ of the concentration of iron in the gallium nitride layer. In this case, the crack generation rate can be further decreased.

It is also preferable that the dislocation density of the gallium nitride layer is $1\times10^7$ cm$^{-2}$ or less. In this case, the crack generation rate can be further decreased. The reason is not perfectly clear, but may be explained as follows. Fe normally tends to concentrate in spaces near a dislocation, and if Fe concentrates in a specific area, the crack generation rate increases. If the dislocation density of the gallium nitride layer is $1\times10^7$ cm$^{-2}$ or less, Fe disperses throughout the entire gallium nitride layer, therefore the crack generation rate decreases.

A method for forming a gallium nitride layer of the present invention comprises a step of forming a gallium nitride layer, of which resistivity is $1\times10^6$ Ω·cm or more and dislocation density is $1\times10^7$ cm$^{-2}$ or less, and which contains iron, on a substrate.

In the method for forming a gallium nitride layer of the present invention, a gallium nitride layer of which crack generation rate is low can be formed. The reason is not perfectly clear, but may be explained as follows. Fe normally tends to concentrate in spaces near a dislocation, and if Fe concentrates in a specific area, the crack generation rate increases. If the dislocation density of the gallium nitride layer is $1\times10^7$ cm$^{-2}$ or less, Fe disperses throughout the entire gallium nitride layer. Therefore the crack generation rate decreases. The resistivity of the gallium nitride layer becomes high, which is $1\times10^6$ Ω·cm or more.

A gallium nitride substrate of the present invention has a resistivity of $1\times10^6$ Ω·cm or more, contains iron, and has a surface which is inclined 0.03° or more from the (0001) plane of the gallium nitride substrate.

The resistivity of the gallium nitride substrate of the present invention is high, which is $1\times10^6$ Ω·cm or more. Also the crack generation rate of the gallium nitride substrate of the present invention is low. The reason is not perfectly clear, but may be explained as follows. Fe enters the Ga site with priority, since the surface of the gallium nitride substrate is inclined 0.03° or more from the (0001) plane of the gallium nitride substrate, hence the distortion of crystals lessens and the crack generation rate decreases.

It is preferable that the gallium nitride substrate contains carbon. In this case, the crack generation rate can be further decreased. The reason is not perfectly clear, but may be explained as follows. Fe enters the Ga site and C enters the N site, and an Fe—C bond is formed. Since distortion of the Fe—C bond is smaller than the Fe—N bond, the crack generation rate of the gallium nitride substrate decreases.

It is also preferable that the concentration of carbon in the gallium nitride substrate is $\frac{1}{20}$ to $\frac{1}{5}$ of the concentration of iron in the gallium nitride substrate. In this case, the crack generation rate can be further decreased.

It is also preferable that the dislocation density of the gallium nitride substrate is $1\times10^7$ cm$^{-2}$ or less. In this case, the crack generation rate can be further decreased. The reason is not perfectly clear, but may be explained as follows. Fe normally tends to concentrate in spaces near a dislocation, and if Fe concentrates in a specific area, the crack generation rate increases. If the dislocation density of the gallium nitride substrate is $1\times10^7$ cm$^{-2}$ or less, Fe disperses throughout the entire gallium nitride substrate. Therefore the crack generation rate decreases.

A gallium nitride substrate of the present invention has a resistivity of $1\times10^6$ Ω·cm or more, contains iron, and carbon.

The resistivity of the gallium nitride substrate of the present invention is high, which is $1\times10^6$ Ω·cm or more. Also the crack generation rate of the gallium nitride substrate of the present invention is low. The reason is not perfectly clear, but may be explained as follows. Fe enters the Ga site and C enters the N site, and an Fe—C bond is formed. Since distortion of the Fe—C bond is smaller than the Fe—N bond, the crack generation rate of the gallium nitride substrate decreases.

It is also preferable that the concentration of carbon in the gallium nitride substrate is $\frac{1}{20}$ to $\frac{1}{5}$ of the concentration of iron in the gallium nitride substrate. In this case, the crack generation rate can be further decreased.

It is also preferable that the dislocation density of the gallium nitride substrate is $1\times10^7$ cm$^{-2}$ or less. In this case, the crack generation rate can be further decreased. The reason is not perfectly clear, but may be explained as follows. Fe normally tends to concentrate in spaces near a dislocation, and if Fe concentrates in a specific area, the crack generation rate increases. If the dislocation density of the gallium nitride substrate is $1\times10^7$ cm$^{-2}$ or less, Fe disperses throughout the entire gallium nitride substrate. Therefore the crack generation rate decreases.

According to the present invention, a gallium nitride substrate of which resistivity is high and crack generation rate is low, and a method for forming such a gallium nitride layer are provided.

Figure 4:
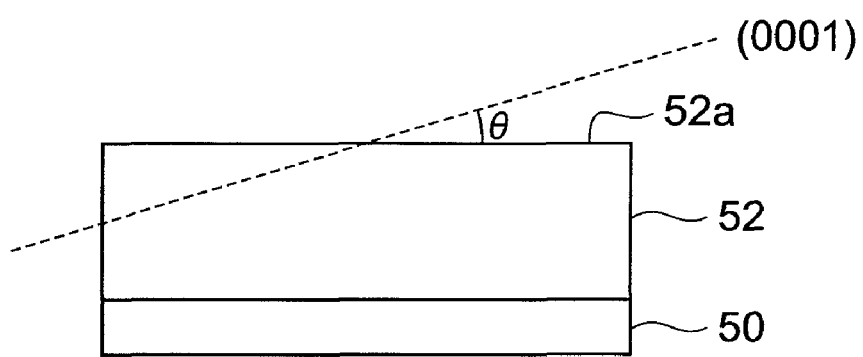
Figure 5:
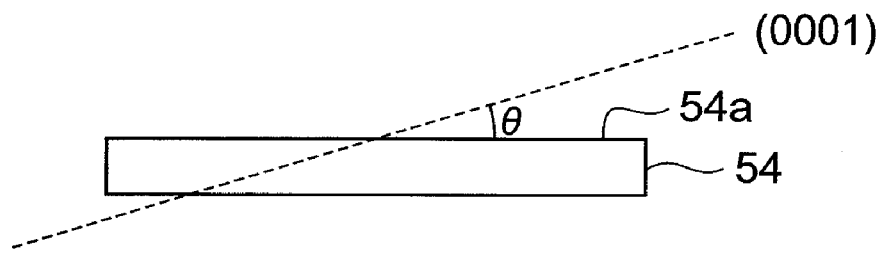

(A) to (D) in FIG. 2 are diagrams depicting steps of a method for forming a gallium nitride layer according to an embodiment, a method for fabricating a gallium nitride substrate using the gallium nitride layer, and a method for fabricating an epitaxial substrate using the gallium nitride substrate;

(A) and (B) in FIG. 3 are graphs depicting a specific example of a time based change of the substrate temperature;

FIG. 4 is a diagram depicting a step of forming the gallium nitride layer;

FIG. 5 is a diagram depicting a step of fabricating the gallium nitride substrate;

FIG. 6 is a table showing an experiment result when a GaN layer is formed according to reference example 1-1 to reference example 1-2, and example 1-1 to example 2-4;

FIG. 7 is a table showing an experiment result when a GaN layer is formed according to example 3-1 to example 3-2;

FIG. 8 is a table showing an experiment result when a GaN layer is formed according to example 4-1 to example 4-54;

FIG. 9 is a table showing an experiment result when a GaN layer is formed according to example 5-1 to example 5-4;

FIG. 10 is a table showing an experiment result when a GaN layer is formed according to example 6-1 to example 6-8;

FIG. 11 is a table showing an experiment result when a GaN layer is formed according to example 7-1 to example 7-10; and FIG. 12 is a table showing an experiment result when a GaN layer is formed according to example 8-1 to example 17-2.

DESCRIPTION OF THE PREFERRED EMBODIMENTS

Embodiments of the present invention will now be described with reference to the accompanying drawings. In the description of the drawings, the same or similar elements are denoted with the same reference symbols, where redundant description is omitted.

Figure 1:
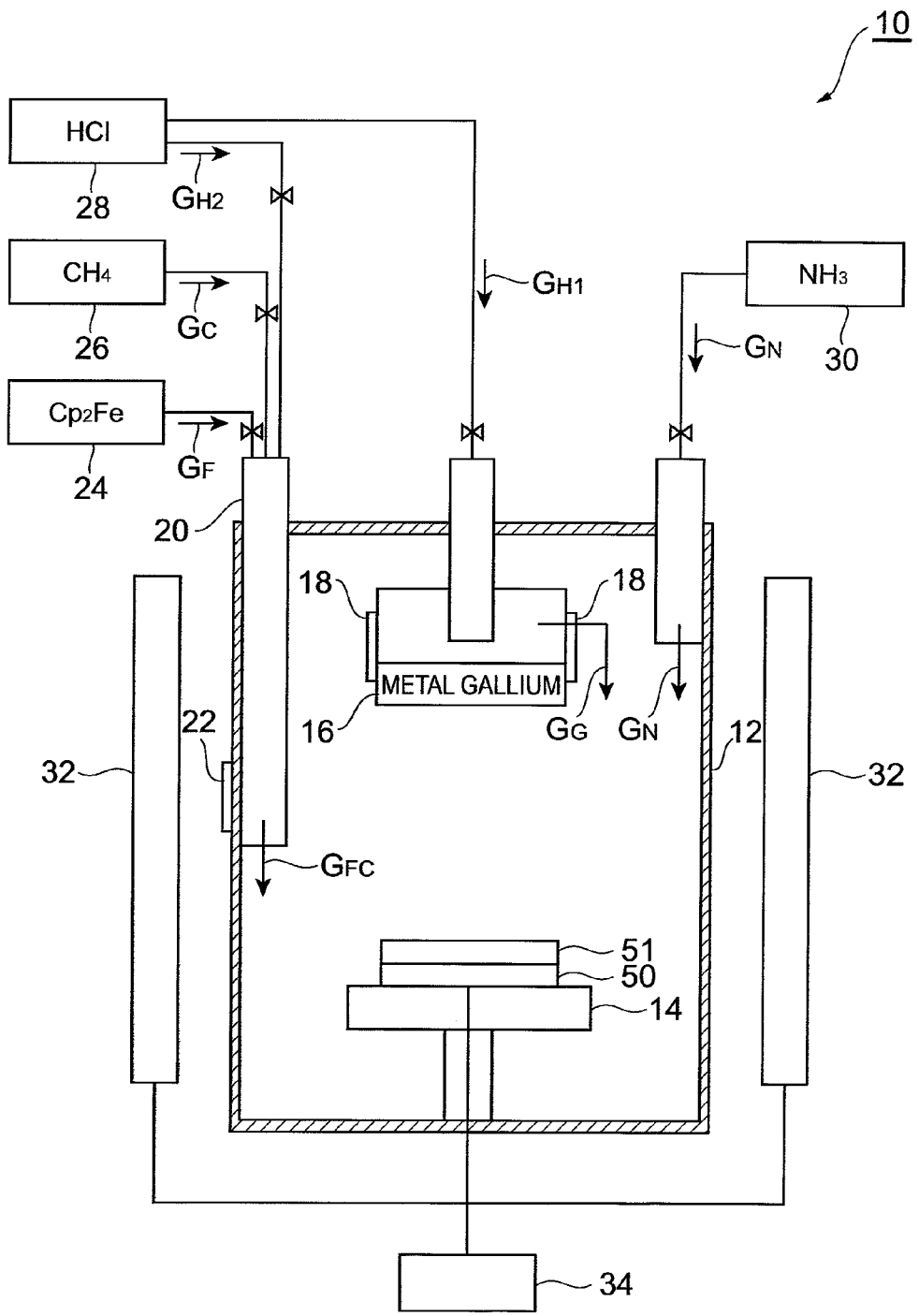
FIG. 1 is a diagram depicting a hydride VPE device for forming a gallium nitride layer containing iron on a substrate.

FIG. 1 is a diagram depicting a hydride VPE device for forming a gallium nitride layer containing iron on a substrate. The hydride VPE device 10 shown in FIG. 1 comprises a growth furnace 12 for accommodating a substrate 50 on which a gallium nitride layer 51 is grown, and a susceper 14 for holding the substrate 50.

A nitrogen supply source 30 for supplying $NH_3$ gas $G_N$ to the growth furnace 12 is connected to the growth furnace 12. A gallium supply source 16 for supplying gallium contained gas $G_G$ into the growth furnace 12 is disposed in the growth furnace 12. The gallium supply source 16 is a source boat where metal gallium, for example, is stored. An HCl supply source 28 for supplying HCl gas $G_{H1}$ for reacting with the metal gallium is connected to the gallium supply source 16. A heater 18 for heating the metal gallium and the HCl gas $G_{H1}$ is installed in the gallium supply source 16. The gallium supply source 16 is maintained at 800° C. or more, for example, by the heater 18. By the metal gallium and the HCl gas $G_{H1}$ reacting under a high temperature, a gallium contained gas $G_G$, such as GaCl, is generated. An example of a chemical reaction formula is shown below.

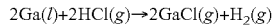

$$2Ga(l)+2HCl(g)\rightarrow 2GaCl(g)+H_2(g)$$

An iron supply source 24 for supplying iron contained gas $G_F$, which is comprised of such an iron compound as ferrocene, for example, is connected to the growth furnace 12. Examples of the iron contained gas $G_F$ are $Cp_2Fe$ (bis(cyclopentadienyl) iron, chemical formula: $(C_5H_5)_2Fe$), and $MeCp_2Fe$ (bis(metylcyclopentadienyl) iron, chemical formula: $(CH_3C_5H_4)_2Fe$). The iron contained gas $G_F$ is transported by carrier gas (e.g. hydrogen gas, mixed gas of hydrogen gas and an inactive gas). HCl gas $G_{H2}$ supplied from the HCl supply source 28 and the iron contained gas $G_F$ are supplied to a mixer 20 in the growth furnace 12. A heater 22 (including a temperature controller) for heating the HCl gas $G_{H2}$ and the iron contained gas $G_F$ is installed in the mixer 20. By the HCl gas $G_{H2}$ and the iron contained gas $G_F$ reacting under high temperature, an iron contained gas $G_{FC}$, such as $FeCl_2$, is generated. An example of the chemical reaction formula is shown below.

$$Cp_2Fe(g)+2HCl(g)\rightarrow 2C_5H_6(g)+FeCl_2(g)$$

An iron contained gas $G_{FC}$, such as $FeCl_3$, may be generated by granular metal iron and HCl gas reacting.

A carbon supply source 26 for supplying such a carbon contained gas $G_C$ as $CH_4$, for example, may be connected to the growth furnace 12. The carbon contained gas $G_C$ is supplied to the mixer 20. A carbon plate may be installed in the growth furnace 12 so as to generate the carbon contained gas $G_C$ from this carbon plate.

A heater 32 for heating the $NH_3$ gas $G_N$, gallium contained gas $G_G$ and iron contained gas $G_{FC}$ is installed around the growth furnace 12. A control device 34 for monitoring the temperature of the substrate 50 is connected to the heater 32. The control device 34 controls the heater 32 so as to maintain the temperature of the substrate 50 at a predetermined temperature. By the $NH_3$ gas $G_N$, gallium contained gas $G_G$ and iron contained gas $G_{FC}$ reacting under high temperature, a gallium nitride layer 51 containing iron is formed on the substrate 50. An example of the chemical reaction formula is shown below.

$$GaCl(g)+NH_3(g)\rightarrow GaN(s)+HCl(g)+H_2(g)$$

(A) to (D) in FIG. 2 are diagrams depicting the steps of the method for forming a gallium nitride layer according to the embodiment, the method for fabricating a gallium nitride substrate using the gallium nitride layer, and the method for fabricating an epitaxial substrate using the gallium nitride substrate.

First a substrate 50 is placed on the suscepter 14 of the hydride VPE device 10 shown in FIG. 1. Then as (A) of FIG. 2 shows, a semi-insulating gallium nitride layer 52 containing iron is formed on the substrate 50 using the hydride VPE device 10. Then as (B) of FIG. 2 shows, a self sustainable gallium nitride layer 52 is obtained by removing the substrate 50. Then as (C) of FIG. 2 shows, a plurality of self sustainable gallium nitride substrates 54 are fabricated by slicing the gallium nitride layer 52 using an inner diameter saw, for example. It is preferable that the gallium nitride substrates 54 are ground and polished after the gallium nitride layer 52 is sliced. The thickness of the gallium nitride substrate 54 is preferably 100 μm or more.

Then as (D) of FIG. 2 shows, an epitaxial substrate 62 is fabricated by forming nitride semiconductor layers 56, 58 and 60 sequentially on the gallium nitride substrate 54. The nitride semiconductor layers 56, 58 and 60 are, for example, an $Al_XIn_YGa_{1-X-Y}N$ layer ($0 \leq X \leq 1$, $0 \leq Y \leq 1$). The epitaxial substrate 62 is used for an electronic device, for example. An example of the electronic device is a field effect transistor.

First Embodiment

A method for forming a gallium nitride layer according to a first embodiment is executed as follows.

First a gallium nitride layer 51 containing iron is formed on a substrate 50 using the hydride VPE device 10 shown in FIG. 1. Supply of HCl gas, for example, is stopped to terminate the growth of the gallium nitride layer 51. It is preferable that the temperature (growth temperature) of the substrate 50, when the gallium nitride layer 51 is formed, is 920 to 1250° C. In this case, a good quality gallium nitride layer 51 with few crystal defects is obtained. The growth time is one hour, for example. The partial pressure of the $NH_3$ gas $G_N$ is 15200 Pa, for example. The partial pressure of the HCl gas $G_{H1}$ is 304 Pa, for example.

A sapphire substrate, a gallium nitride substrate, a GaAs substrate, an SiC substrate, a GaP substrate or an InP substrate, for example, can be used for the substrate 50. The growth plane of the sapphire substrate or the SiC substrate is preferably a (0001) plane. The growth plane of the GaAs substrate, GaP substrate or InP substrate is preferably an (111) A plane (III group plane). If a substrate other than a gallium nitride substrate is used for the substrate 50, it is preferable that a mask layer, having an opening pattern, is formed on the substrate 50. This mask layer is such an insulating material as silicon oxide. The thickness of the mask layer is 100 nm, for example.

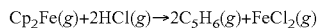

Then the gallium nitride layer 51 formed on the substrate 50 is heated (annealed). By this, the gallium nitride layer 52 is formed on the substrate 50, as shown in (A) of FIG. 2. Then, as (B) of FIG. 2 shows, the self sustainable gallium nitride layer 52 is obtained by removing the substrate 50. The gallium nitride layer 52 is comprised of hexagonal system GaN mono-crystals. The thickness of the gallium nitride layer 52 is 7 mm, for example, and the diameter of the gallium nitride layer 52 is 50 mm, for example. The temperature (heating temperature) of the substrate 50, when the gallium nitride layer 51 is heated, is preferably 800 to 1200° C. The heating time is preferably 5 to 300 minutes. During the heating time, the heating temperature may be maintained at a same temperature, or may be gradually decreased.

The resistivity of the gallium nitride layer 52 is $1\times10^6$ Ω·cm or more, and is preferably $1\times10^7$ Ω·cm or more, and more preferably is $1\times10^{11}$ Ω·cm or less. The resistivity of the gallium nitride layer 52 can be increased by increasing the concentration of iron in the gallium nitride layer 52, for example. The resistivity of the gallium nitride layer 52 is measured by disposing a pair of electrodes on the surface of the gallium nitride layer 52, and supplying current here. The thickness of the gallium nitride layer 52 is preferably 100 μm or more in terms of ease of handling, and more preferably is 400 μm or more.

It is preferable that the concentration of iron in the gallium nitride layer 52 is $5\times10^{16}$ cm$^{-3}$ or more and $5\times10^{19}$ cm$^{-3}$ or less. If the concentration of iron is within this range, a drop in resistivity or deterioration of crystallinity, which occurs when a large amount of iron is added, can be suppressed. The concentration of iron in the gallium nitride layer 52 is measured by SIMS (Secondary Ion Mass Spectrometry).

A buffer layer comprised of gallium nitride may be formed on the substrate 50 before forming the gallium nitride layer 51. The thickness of the buffer layer is 60 nm, for example. The temperature of the substrate 50, when the buffer layer is formed, is 500° C., for example. When the buffer layer is formed, the crystallinity of the gallium nitride layer 51 improves.

In the method for forming the gallium nitride layer of the present embodiment, the gallium nitride layer 52 of which crack generation rate is low can be formed by heating the gallium nitride layer 51. The reason is not perfectly clear, but may be explained as follows. Iron (Fe) could exist in a crystal lattice formed of gallium (Ga) and nitrogen (N) at high probability. If the gallium nitride layer 51 is heated, Fe existing in the crystal lattice moves to the Ga site. As a result, the crack generation rate of the gallium nitride layer 52 decreases. Hence the fabrication yield of the gallium nitride layer 52 can be increased. The generation of cracks can be checked by observing the surface of the gallium nitride layer 52 by microscope. The resistivity of the gallium nitride layer 52 becomes high, which is $1\times10^6$ Ω·cm or more.

If the gallium nitride layer 51 is heated at 800° C. or higher for five minutes or more, the crack generation rate can be further decreased. It is preferable that the gallium nitride layer 51 is heated at 800 to 1200° C. for 5 to 300 minutes. If the gallium nitride layer 51 is heated at the temperature falling rate of 50° C./minute or less, the crack generation rate can be further decreased. It is preferable that the gallium nitride layer 51 is heated at the temperature falling rate of over 0° C./minute and not more than 50° C./minute.

(A) of FIG. 3 and (B) of FIG. 3 are graphs depicting examples of a time based change of temperature of the substrate 50. As (A) of FIG. 3 and (B) of FIG. 3 show, the gallium nitride layer 51 is formed on the substrate 50 from time 0 to time $t_0$ while maintaining the temperature of the substrate 50 at growth temperature $T_0$ (e.g. $T_0=1100°$ C.). The time 0 is a time when the growth of the gallium nitride layer 51 is started, and time $t_0$ is a time when the growth of the gallium nitride layer 51 is stopped. Then as (A) of FIG. 3 shows, the gallium nitride layer 51 is heated from time $t_0$ to time $t_1$ while dropping the temperature at the temperature falling rate 50° C./minute or less. By this, the gallium nitride layer 52 is formed on the substrate 50. At time $t_1$, the temperature of the substrate 50 has been dropped to the annealing termination temperature $T_1$ (e.g. $T_1=500°$ C.). After the gallium nitride layer 51 is formed on the substrate 50, the gallium nitride layer 51 may be heated from time $t_0$ to time $t_2$ at the growth temperature $T_0$, as shown in (B) of FIG. 3. Then the gallium nitride layer 51 may be heated from time $t_2$ to time $t_3$ while dropping the temperature at an arbitrary temperature falling rate. By this, the gallium nitride layer 52 is formed on the substrate 50. At time $t_3$, the temperature of the substrate 50 has been dropped to the annealing termination temperature $T_1$.

After forming the gallium nitride layer 52 on the substrate 50, the gallium nitride substrate 54 is fabricated through each step shown in (B) of FIG. 2 and (C) of FIG. 2. The resistivity of the gallium nitride substrate 54 is $1\times10^6$ Ω·cm or more. The crack generation rate is also low. The crack generation is checked by observing the surface of the gallium nitride substrate 54 using a differential interference microscope. Then the epitaxial substrate 62 is fabricated through the step shown in (D) of FIG. 2.

Second Embodiment

A method for forming a gallium nitride layer according to a second embodiment is executed as follows. As FIG. 4 shows, a gallium nitride layer 52, of which resistivity is $1\times10^6$ Ω·cm or more and which contains iron, is formed on a substrate 50 using the hydride VPE device 10. FIG. 4 is a diagram depicting the gallium nitride layer formation step. In this case, the surface 52a of the gallium nitride layer 52 is inclined 0.03° or more from the (0001) plane (also called "C plane") of the gallium nitride layer 52. In other words, an angle θ (also called "off angle") formed between the surface 52a of the gallium nitride layer 52 and the (0001) plane of the gallium nitride layer 52 is 0.03° or more. The angle θ is preferably 0.2° to 60°. The angle θ is measured by X-ray diffraction.

The surface 52a of the gallium nitride layer 52 may be a plane obtained by inclining the normal line of the (0001) plane by angle θ in the <11-20> direction, or may be a plane obtained by inclining the normal line of the (0001) plane by angle θ in the <1-100> direction.

The substrate 50 may be a gallium nitride substrate having a surface which is inclined 0.03° or more from the (0001) plane, or may be a GaAs substrate, GaP substrate or InP substrate of which surface has the (111) A plane. The inclination angle of the surface 52a of the gallium nitride layer 52 formed on the GaAs substrate of which surface has the (111) A plane, for example, can be controlled as follows. If the GaAs (111) plane is inclined by 0.03° in the <1-10> direction, the (0001) plane of the obtained GaN crystals is inclined 0.03° in the <11-20> direction. If the GaAs (111) plane is inclined by 0.03° in the <11-2> direction, then the (0001) plane of the obtained GaN crystals is inclined 0.03° in the <1-100> direction. If the GaAs (111) plane is inclined 0.03° in the <1-10> direction and 0.03° in the <11-2> direction, the (0001) plane of the obtained GaN crystals is inclined 0.03° in the <11-20> direction and 0.03° in the <1-100> direction.

In the method for forming the gallium nitride layer of the present embodiment, the gallium nitride layer 52 of which crack generation rate is low can be formed. The reason is not perfectly clear, but may be explained as follows. Micro-step differences are formed on the surface 52a of the gallium nitride layer 52. Fe, which is filled from the corners of the step differences, easily enters the Ga site. As a result, the crack generation rate of the gallium nitride layer 52 decreases. Hence the fabrication yield of the gallium nitride layer 52 can be increased. The resistivity of the gallium nitride layer 52 becomes high, which is $1 \times 10^6$ Ω·cm or more.

After forming the gallium nitride layer 52, the gallium nitride substrate 54 is fabricated through each step shown in (B) of FIG. 2 and (C) of FIG. 2.

The resistivity of the gallium nitride substrate 54 is high, which is $1 \times 10^6$ Ω·cm or more. The gallium nitride substrate 54 contains iron. And the crack generation rate is low. As FIG. 5 shows, the gallium nitride substrate 54 has a surface 54a which is inclined 0.03° or more from the (0001) plane of the gallium nitride substrate 54. In other words, the angle θ formed by the surface 54a of the gallium nitride substrate 54 and the (0001) plane of the gallium nitride substrate 54 is 0.03° or more. FIG. 5 is a diagram depicting the fabrication step of the gallium nitride substrate.

Then the epitaxial substrate 62 is fabricated through the step shown in (D) of FIG. 2.

The gallium nitride substrate 54 according to the present embodiment may be fabricated as follows. First a gallium nitride layer 51 of which surface is an arbitrary crystal plane (e.g. (0001) plane) is formed on a substrate 50. After removing the substrate 50, the gallium nitride layer 51 is sliced or polished along a plane which is inclined 0.03° or more from the (0001) plane of the gallium nitride layer 51. In this case as well, the resistivity of the gallium nitride substrate 54 is high, $1 \times 10^6$ Ω·cm or more, and the crack generation rate of the gallium nitride substrate 54 is low.

Third Embodiment

A method for forming a gallium nitride layer according to a third embodiment is executed as follows. As (A) of FIG. 2 shows, a gallium nitride layer 52, of which resistivity is $1 \times 10^6$ Ω·cm or more and which contains iron and carbon, is formed on a substrate 50 using the hydride VPE device 10. The gallium nitride layer 52 is formed, for example, by supplying carbon contained gas $G_C$ to the substrate 50. The resistivity of the gallium nitride layer 52 is hardly influenced by the concentration of carbon in the gallium nitride layer 52.

In the method for forming the gallium nitride layer of the present embodiment, the gallium nitride layer 52 of which crack generation rate is low can be formed. The reason is not perfectly clear, but may be explained as follows. Fe enters the Ga site and C enters the N site, and an Fe—C bond is formed. The distortion of the Fe—C bond is smaller than the Fe—N bond, so the crack generation rate of the gallium nitride layer 52 decreases. Hence the fabrication yield of the gallium nitride layer 52 can be increased. The resistivity of the gallium nitride layer 52 becomes high, which is $1 \times 10^6$ Ω·cm or more.

If the concentration of carbon in the gallium nitride layer 52 is 1/20 to 1/5 of the concentration of iron in the gallium nitride layer 52, the crack generation rate can be further decreased. It is preferable that the concentration of carbon in the gallium nitride layer 52 is 1/10 to 1/5 of the concentration of iron in the gallium nitride layer 52. The concentration of carbon in the gallium nitride layer 52 is measured by SIMS. The rate of the concentration of carbon in the gallium nitride layer 52 and the concentration of iron in the gallium nitride layer 52 can be adjusted by the flow rate ratio of the carbon contained gas $G_C$ and the iron contained gas $G_F$, for example.

After forming the gallium nitride layer 52, the gallium nitride substrate 54 is fabricated through each step shown in (B) of FIG. 2 and (C) of FIG. 2.

The resistivity of the gallium nitride substrate 54 according to the present embodiment is high, which is $1 \times 10^6$ Ω·cm or more. The gallium nitride substrate 54 contains iron and carbon. The crack generation rate of the gallium nitride substrate 54 is low. The reason is not perfectly clear, but may be explained as follows. Fe enters the Ga site and C enters the N site, and an Fe—C bond is formed. Since the distortion of the Fe—C bond is smaller than the Fe—N bond, the crack generation rate of the gallium nitride substrate 54 decreases.

If the concentration of carbon in the gallium nitride substrate 54 is 1/20 to 1/5 of the concentration of iron in the gallium nitride substrate 54, the crack generation rate can be further decreased.

Then the epitaxial substrate 62 is fabricated through the step shown in (D) of FIG. 2.

Fourth Embodiment

A method for forming a gallium nitride layer according to a fourth embodiment is executed as follows. As (A) of FIG. 2 shows, a gallium nitride layer 52, of which resistivity is $1 \times 10^6$ Ω·cm or more and dislocation density is $1 \times 10^7$ cm$^{-2}$ or less and which contains iron, is formed on a substrate 50 using the hydride VPE device 10. The dislocation density is preferably $1 \times 10^7$ cm$^{-2}$ or less, and is more preferably $2 \times 10^6$ cm$^{-2}$ or less. The dislocation density of the gallium nitride layer 52 is represented by the etch pits density (EPD). The etch pits density is calculated by counting the number of etch pits in a 100 μm square area at an arbitrary six locations using SEM. If a gallium nitride substrate, of which dislocation density is $1 \times 10^7$ cm$^{-2}$ or less, for example, is used as the substrate 50, the dislocation density of the gallium nitride layer 52 can be $1 \times 10^7$ cm$^{-2}$ or less. In the case of using a sapphire substrate, GaAs substrate, SiC substrate, GaP substrate or InP substrate as the substrate 50, the dislocation density of the gallium nitride layer 52 can be $1 \times 10^7$ cm$^{-2}$ or less, if a mask layer having opening patterns is formed on the substrate 50, and the gallium nitride layer 52 is formed so as to bury the opening patterns.

In the method for forming the gallium nitride layer of the present embodiment, the gallium nitride layer 52 of which crack generation rate is low can be formed. The reason is not perfectly clear, but may be explained as follows. Fe normally tends to concentrate in spaces near a dislocation, and if Fe concentrates in a specific area, the crack generation rate increases. If the dislocation density of the gallium nitride layer 52 is $1 \times 10^7$ cm$^{-2}$ or less, Fe disperses throughout the entire gallium nitride layer 52. Therefore the crack generation rate decreases, and the resistivity of the gallium nitride layer 52 becomes high, which is $1 \times 10^6$ Ω·cm or more. Hence the fabrication yield of the gallium nitride layer 52 can be increased.

After forming the gallium nitride layer 52, the gallium nitride substrate 54 is fabricated through each step shown in (B) of FIG. 2 and (C) of FIG. 2. The resistivity of the gallium nitride substrate 54 is high, which is $1 \times 10^6$ Ω·cm or more. The dislocation density of the gallium nitride substrate 54 is $1 \times 10^7$ cm$^{-2}$ or less. The crack generation rate of the gallium nitride substrate 54 of the present embodiment is low. The reason is not perfectly clear, but may be explained as follows. Fe normally tends to concentrate in spaces near a dislocation, and if Fe concentrates in a specific area, the crack generation rate increases. If the dislocation density of the gallium nitride substrate 54 is $1 \times 10^7$ cm$^{-2}$ or less, Fe disperses throughout the entire substrate in the gallium nitride substrate 54. Therefore the crack generation rate decreases.

Then the epitaxial substrate 62 is fabricated through the step shown in (D) of FIG. 2.

Preferred embodiments of the present invention were described above, but the present invention is not limited to these embodiments.

For example, the gallium nitride layer 52 may be formed using an organo-metal hydrogen chloride VPE device, instead of the hydride VPE device.

In the first embodiment, the surface 52a of the gallium nitride layer 52 may be inclined 0.03° or more from the (0001) plane of the gallium nitride layer 52, just like the second embodiment. Also in the first embodiment, the gallium nitride layer 52 may contain carbon, just like the third embodiment, or the concentration of carbon in the gallium nitride layer 52 may be 1/20 to 1/5 of the concentration of iron in the gallium nitride layer 52. Also in the first embodiment, the dislocation density of the gallium nitride layer 52 may be $1 \times 10^7$ cm$^{-2}$ or less, just like the fourth embodiment. Also in the first embodiment, two or more of the first to fourth embodiments may be combined. In these cases, similar functional effects as the second to the fourth embodiments can also be implemented in the first embodiment.

In the second embodiment, the gallium nitride layer 52 may contain carbon, just like the third embodiment, or the concentration of carbon in the gallium nitride layer 52 may be 1/20 to 1/5 of the concentration of iron in the gallium nitride layer 52. In the second embodiment, the dislocation density of the gallium nitride layer 52 may be $1 \times 10^7$ cm$^{-2}$ or less, just like the fourth embodiment. In the second embodiment, the third and fourth embodiments may be combined. In these cases, functional effects similar to the third and fourth embodiments can be implemented in the second embodiment.

In the third embodiment, the dislocation density of the gallium nitride layer 52 may be $1 \times 10^7$ cm$^{-2}$ or less, just like the fourth embodiment. In this case, functional effects similar to the fourth embodiment can be implemented in the third embodiment.

Also in the second embodiment, the gallium nitride substrate 54 may contain carbon, just like the third embodiment, or the concentration of carbon in the gallium nitride substrate 54 may be 1/20 to 1/5 of the concentration of iron in the gallium nitride substrate 54. Also in the second embodiment, the dislocation density of the gallium nitride substrate 54 may be $1 \times 10^7$ cm$^{-2}$ or less, just like the fourth embodiment. Also in the second embodiment, the third and fourth embodiments may be combined. In these cases, functional effects similar to the third and fourth embodiments can be implemented in the second embodiment.

Also in the third embodiment, the dislocation density of the gallium nitride substrate 54 may be $1 \times 10^7$ cm$^{-2}$ or less, just like the fourth embodiment. In this case, functional effects similar to the fourth embodiment can be implemented in the third embodiment.

EXAMPLES

Now the present invention will be described in detail based on examples, but the present invention is not limited to the following examples.

FIG. 6 is a table showing the experiment results when a GaN layer is formed in reference example 1-1 to reference example 1-2, and example 1-1 to example 2-4.

Reference Example 1-1

First a GaN layer of which concentration of iron is $5.0 \times 10^{16}$ cm$^{-3}$ is grown in a 2 inch GaN substrate (diameter: 50.8 mm) at growth temperature ($T_0$) 1100° C. After the GaN layer is grown, the GaN layer is annealed for 6 minutes while dropping the temperature from 1100° C. to 500° C. at the temperature falling rate 100° C./minute.

The concentration of carbon in the GaN layer is the detection limit or less. The surface of the GaN layer is obtained by inclining the normal line of the (0001) plane by 0.01° in the <11-20> direction, and 0.01° in the <1-100> direction. The dislocation density of the GaN layer is $5.0 \times 10^7$ cm$^{-2}$.

The resistivity of the GaN layer is $5.0 \times 10^5$ Ω·cm. The ratio of [the samples where] a crack was not generated in the GaN layer (that is, the fabrication yield of the GaN layer) is 68% (the number of samples is 120). The radius of curvature of the crystals where a crack was not generated, based on measurement by a profilometer, is 85 cm on average. The radius of curvature indicates that the off angle of the crystals have distribution in the substrate, and the distribution of the off angle in the substrate decreases as the radius of curvature increases.

Reference Example 1-2

A GaN layer is formed in the same manner as the reference example 1-1, except that the concentration of iron is $5.0 \times 10^{19}$ cm$^{-3}$. The resistivity and yield are as shown in FIG. 6. The radius of curvature of the crystals where a crack was not generated is 80 cm on average.

Example 1-1 to Example 1-10

In example 1-1 to example 1-10, an experiment is performed for each GaN layer having two types of concentration of iron, changing the temperature falling rate.

In example 1-1, a GaN layer is formed in the same manner as reference example 1-1, except that the temperature falling rate is 50° C./minute, the annealing time is 12 minutes, and the concentration of carbon in the GaN layer is $1.7 \times 10^{15}$ cm$^{-3}$. The resistivity and yield are as shown in FIG. 6.

In example 1-2 to example 1-10, a GaN layer is formed in the same manner as example 1-1, except that the concentration of iron, temperature falling rate, annealing time and concentration of carbon are changed as required. The resistivity and yield are as shown in FIG. 6. The radius of curvature of the crystals obtained in example 1-1 to 1-10 is 160 cm or more for all crystals.

Example 2-1 to Example 2-4

In example 2-1 to 2-4, an experiment is performed for each GaN layer having two types of concentration of iron, changing the growth temperature ($T_0$).

In example 2-1, a GaN layer is formed in the same manner as example 1-1, except that the growth temperature ($T_0$) is 1050° C., and the annealing time is 11 minutes. The resistivity and yield are as shown in FIG. 6.

In example 2-2 to example 2-4, a GaN layer is formed in the same manner as example 2-1, except that the concentration of iron, growth temperature (T0), annealing time and concentration of carbon are changed as required. The resistivity and yield are as shown in FIG. 6. The radius of curvature of the crystals obtained in example 2-1 to example 2-4 is 160 cm or more for all crystals.

FIG. 7 is a table showing the experiment results when a GaN layer is formed in example 3-1 to example 3-2.

Example 3-1 to Example 3-2

In example 3-1 to example 3-2, an experiment is performed for each GaN layer having two types of concentration of iron, changing the annealing conditions.

In example 3-1, a GaN layer is formed in the same manner as example 1-1, except that after growing the GaN layer, the GaN layer is annealed for 5 minutes at 1100° C., then the GaN layer is further annealed for 6 minutes while decreasing the temperature from 1100° C. at temperature falling rate 100° C./minute. The resistivity and yield are as shown in FIG. 7.

In example 3-2, a GaN layer is formed in the same manner as example 3-1, except that the concentration of iron is $5.0\times10^9$ $cm^{-3}$. The resistivity and yield are as shown in FIG. 7. The radius of curvature of the crystals obtained in example 3-1 to example 3-2 is 160 cm or more for all crystals.

FIG. 8 is a table showing the experiment results of a GaN layer formed in example 4-1 to example 4-54.

Example 4-1 to Example 4-54

In example 4-1 to example 4-54, an experiment is performed for each GaN layer having two types of concentration of iron, changing the off angle on the surface of the GaN layer.

In example 4-1, a GaN layer is formed in the same manner as example 1-1, except that the temperature falling rate is 60° C./minute, the annealing time is 10 minutes, and the surface of the GaN layer is a surface where the normal line of the (0001) plane of the GaN layer is inclined 0.03° in the <11-20> direction. The resistivity and yield are as shown in FIG. 8.

In example 4-2 to example 4-54, a GaN layer is formed in the same manner as example 1-1, except that the concentration of iron, concentration of carbon and off angle are changed as required. The resistivity and yield are as shown in FIG. 8. The radius of curvature of the crystals obtained in example 4-1 to example 4-54 is 170 cm or more for all crystals.

FIG. 9 is a table showing the experiment result when a GaN layer is formed in example 5-1 to example 5-4.

Example 5-1 to Example 5-4

In example 5-1 to example 5-4, an experiment is performed for each GaN layer having two types of concentration of iron, changing the concentration of carbon in the GaN layer.

In example 5-1, a GaN layer is formed in the same manner as example 1-1, except that the temperature falling rate is 60° C./minute, annealing time is 10 minutes, and concentration of carbon is $4.0\times10^{15}$ $cm^{-3}$. The resistivity and yield are as shown in FIG. 9.

In example 5-2 to example 5-4, a GaN layer is formed in the same manner as example 5-1, except that the concentration of iron and concentration of carbon are changed as required. The resistivity and yield are as shown in FIG. 9. The radius of curvature of the crystals obtained in example 5-1 to example 5-4 is 160 cm or more for all crystals.

FIG. 10 is a table showing the experiment result when a GaN layer is formed in example 6-1 to example 6-8.

Example 6-1 to Example 6-8

In example 6-1 to example 6-8, an experiment is performed for each GaN layer having two types of concentration of iron, changing the dislocation density of the GaN layer.

In example 6-1, a GaN layer is formed in the same manner as example 1-1, except that the temperature falling rate is 60° C./minute, annealing time is 10 minutes, and dislocation density is $1.0\times10^7$ $cm^{-2}$. The resistivity and yield are as shown in FIG. 10.

In example 6-2 to example 6-8, a GaN layer is formed in the same manner as example 6-1, except that the concentration of iron, concentration of carbon and dislocation density are changed as required. The resistivity and yield are as shown in FIG. 10. The radius of curvature of the crystals obtained in example 6-1 to example 6-8 is 160 cm or more for all crystals.

FIG. 11 is a table showing an experiment result when a GaN layer is formed in example 7-1 to example 7-10.

Example 7-1 to Example 7-10

In example 7-1 to example 7-10, an experiment is performed using the substrates formed of various materials, instead of a GaN substrate.

In example 7-1, a GaN layer is formed in the same manner as example 1-6, except that the substrate material is sapphire, temperature falling rate is 60° C./minute, annealing time is 10 minutes, and the surface of the GaN layer is obtained by inclining the normal line of the (0001) plane of the GaN layer 0.2° in the <11-20> direction, and 0.2° in the <1-100> direction. The resistivity and yield are as shown in FIG. 11.

In example 7-2 to example 7-10, a GaN layer is formed in the same manner as example 7-1, except that the substrate material and off angle are changed as required. The resistivity and yield are as shown in FIG. 11. The radius of curvature of the crystals obtained in example 7-1 to example 7-10 is 160 cm or more for all crystals.

FIG. 12 is a table showing an experiment result when a GaN layer is formed in example 8-1 to example 17-2.

Example 8-1 to Example 8-2

In example 8-1 and example 8-2, a GaN layer is formed in the same manner as example 1-2 and example 1-7, except that the concentration of carbon is changed. The resistivity and yield are as shown in FIG. 12. The radius of curvature of the crystals obtained in example 8-1 to example 8-2 is 160 cm or more for all crystals.

Example 9-1 to Example 9-2

In example 9-1 and example 9-2, a GaN layer is formed in the same manner as example 8-1 and example 8-2, except that the concentration of carbon and off angle are changed. The resistivity and yield are as shown in FIG. 12. The radius of curvature of the crystals obtained in example 9-1 to example 9-2 is 160 cm or more for all crystals.

Example 10-1 to Example 10-2

In example 10-1 and example 10-2, a GaN layer is formed in the same manner as example 8-1 and example 8-2, except that the concentration of carbon and dislocation density are changed. The resistivity and yield are as shown in FIG. 12.

Example 11-1 to Example 11-2

In example 11-1 and example 11-2, a GaN layer is formed in the same manner as example 8-1 and example 8-2, except that the temperat falling rate, annealing time and dislocation density are changed. The resistivity and yield are as shown in FIG. 12.

Example 12-1 to Example 12-2

In example 12-1 and example 12-2, a GaN layer is formed in the same manner as example 8-1 and example 8-2, except that the temperature falling rate, annealing time, concentration of carbon, off angle and dislocation density are changed. The resistivity and yield are as shown in FIG. 12. The radius of curvature of the crystals obtained in example 10-1 to example 12-2 is 160 cm or more for all crystals.

Example 13-1 to Example 13-2

In example 13-1 and example 13-2, a GaN layer is formed in the same manner as example 8-1 and example 8-2, except that the temperature falling rate, annealing time and off angle are changed. The resistivity and yield are as shown in FIG. 12.

Example 14-1 to Example 14-2

In example 14-1 and example 14-2, a GaN layer is formed in the same manner as example 8-1 and example 8-2, except that the off angle is changed. The resistivity and yield are as shown in FIG. 12.

Example 15-1 to Example 15-2

In example 15-1 and example 15-2, a GaN layer is formed in the same manner as example 8-1 and example 8-2, except that the dislocation density is changed. The resistivity and yield are as shown in FIG. 12.

Example 16-1 to Example 16-2

In example 16-1 and example 16-2, a GaN layer is formed in the same manner as example 8-1 and example 8-2, except that the temperature falling rate, annealing time, off angle and dislocation density are changed. The resistivity and yield are as shown in FIG. 12.

Example 17-1 to Example 17-2

In example 17-1 and example 17-2, a GaN layer is formed in the same manner as example 8-1 and example 8-2, except that the off angle and dislocation density are changed. The resistivity and yield are as shown in FIG. 12. The radius of curvature of the crystals obtained in example 13-1 to example 17-2 is 200 cm or more for all crystals.

What is claimed is:

1. A method for forming a gallium nitride layer of which resistivity is $1 \times 10^6$ Ω·cm or more, comprising steps of:
    forming a gallium nitride layer containing iron on a substrate; and
    after forming the gallium nitride layer heating said gallium nitride layer formed on said substrate,
    wherein said gallium nitride layer is heated at 800° C. or higher for five minutes or more, and wherein said gallium nitride layer is cooled at between 2 and 60° C./minute of a temperature falling rate.

2. The method for forming a gallium nitride layer according to claim 1, wherein a surface of said gallium nitride layer is inclined 0.03° or more from a (0001) plane of said gallium nitride layer.

3. The method for forming a gallium nitride layer according to claim 1, wherein said gallium nitride layer contains carbon.

4. The method for forming a gallium nitride layer according to claim 1, wherein a dislocation density of said gallium nitride layer is $1 \times 10^7$ cm$^{-2}$ or less.

* * * * *